(12) United States Patent
Lipavsky

(10) Patent No.: US 9,697,944 B2
(45) Date of Patent: Jul. 4, 2017

(54) DEVICE FOR DELIVERING GALVANIC ISOLATED DIGITAL VIDEO AT HIGH FREQUENCIES

(71) Applicant: SILORA R&D (A.S.C.) LTD., Ashrat (IL)

(72) Inventor: Ilya Lipavsky, Kyriat Ata (IL)

(73) Assignee: SILORA R&D (A.S.C.) LTD., Ashrat (IL)

( * ) Notice: Subject to any disclaimer, the term of this patent is extended or adjusted under 35 U.S.C. 154(b) by 82 days.

(21) Appl. No.: 14/409,403

(22) PCT Filed: Jun. 12, 2013

(86) PCT No.: PCT/IL2013/000056
§ 371 (c)(1),
(2) Date: Dec. 18, 2014

(87) PCT Pub. No.: WO2013/190536
PCT Pub. Date: Dec. 27, 2013

(65) Prior Publication Data
US 2015/0194253 A1 Jul. 9, 2015

(30) Foreign Application Priority Data
Jun. 19, 2012 (IL) .......................... 220502

(51) Int. Cl.
*H01F 27/28* (2006.01)
*H01P 1/06* (2006.01)
(Continued)

(52) U.S. Cl.
CPC ........... *H01F 17/062* (2013.01); *H01F 19/04* (2013.01); *H05K 1/18* (2013.01); *H01F 2019/085* (2013.01)

(58) Field of Classification Search
CPC .. H01F 17/062; H01F 19/04; H01F 2019/085; H05K 1/18
(Continued)

(56) References Cited

U.S. PATENT DOCUMENTS 3,168,715 A * 2/1965 Woodworth .......... H01F 17/062
333/119
3,546,571 A * 12/1970 Fletcher .................... G05F 3/06
323/309
(Continued)

FOREIGN PATENT DOCUMENTS

CN      201893216 U    7/2011
CN      201893224 U * 7/2011
(Continued)

OTHER PUBLICATIONS

International Search Report and Written Opinion in PCT/IL2013/000056.

*Primary Examiner* — Mangtin Lian
*Assistant Examiner* — Kazi Hossain
(74) *Attorney, Agent, or Firm* — Ted Whitlock

(57) ABSTRACT

A transmission line transformer (TLT) and a device for delivering serial digital signals at relatively high rates which comprises four such TLTs is provided. Each TLT has a primary and secondary coils winded at the same direction around a common core. Each of the primary and secondary coils comprises two segments of wires. The four segments of wires are grouped to a bundle which is axially twisted, wherein this twisting is characterized by a predefined number of full rotations relative to the axis of the bundle per a unit length, measured along this axis.

5 Claims, 3 Drawing Sheets

(51) Int. Cl.
*H03H 7/38* (2006.01)
*H01F 17/06* (2006.01)
*H05K 1/18* (2006.01)
*H01F 19/04* (2006.01)
*H01F 19/08* (2006.01)

(58) Field of Classification Search
USPC .................................... 336/232, 220, 229
See application file for complete search history.

(56) References Cited

U.S. PATENT DOCUMENTS

| | | | | | |
|---|---|---|---|---|---|
| 4,088,942 | A | * | 5/1978 | Miko | G05F 3/06 315/411 |
| 4,142,178 | A | * | 2/1979 | Whyte | H04B 3/56 307/149 |
| 4,422,056 | A | * | 12/1983 | Roberts | H03H 7/09 315/239 |
| 4,774,649 | A | * | 9/1988 | Archer | H02M 3/33538 323/247 |
| 5,461,215 | A | * | 10/1995 | Haldeman | H05B 6/42 174/15.6 |
| 2007/0040645 | A1 | * | 2/2007 | Sedio | H01F 19/06 336/232 |
| 2010/0255726 | A1 | * | 10/2010 | Huang | H01R 13/6658 439/607.01 |
| 2011/0151717 | A1 | * | 6/2011 | Ge | H01R 13/6658 439/620.07 |

FOREIGN PATENT DOCUMENTS

| | | |
|---|---|---|
| CN | 201893224 U | 7/2011 |
| CN | 202282235 U | 6/2012 |
| CN | 202662422 U | 6/2013 |

\* cited by examiner

DEVICE FOR DELIVERING GALVANIC ISOLATED DIGITAL VIDEO AT HIGH FREQUENCIES

FIELD OF THE INVENTION

The present invention relates in general to transmission line transformers for delivering signals in the range of a few dozens of MHz and up to 2 GHz. In more particular the present invention relates to a device providing for delivering serial digital data stream such as video signals originated by a high definition TV source. This invention also relates to electrical isolating circuits in particular electrical isolating circuits for use in endoscopic video cameras.

BACKGROUND OF THE INVENTION

Transformation devices and transmission line transformers (TLTs) among them are normally employed in cases in which galvanic isolation, elimination of ground loops, impedance transformation and/or phase inversion are required. U.S. Pat. No. 5,220,297 teaches a TLT having a body that is made of a magnetically permeable material in which a number of passages are structured. Each of these passages is adapted to receive one or more electrical conductors. The conductors are threaded up one passage, extend along a spacing separating between the passages and threaded down another passage. The insulation of the conductors and the spacing separating between them are adapted to provide given impedance across the bandwidth of operation. The dimensions of the body and the spacing between adjacent passages are adapted to provide isolation between the conductors and selected impedance across the bandwidth. In U.S. Pat. No. 5,716,323 an isolation circuit for use in video cameras that are coupled to endoscopes is disclosed. This isolation circuit provides for transmitting video signals by means of electrical wiring instead of transmitting the raw images by means of fiber optic cables. The electrical isolation is required to maintain the safety of patients as well as of the care providing personnel who are involved in such endoscopic procedures.

High definition video camera heads employing transmission techniques such as TMDS or LVDS are commercially available. Therefore, there is a need for a device that avoids the use of fiber optic, provides for transmitting serial digital signals at high rates such as originated by high definition video sources and provides for an electrical isolation at a level in accordance with safety regulations.

DETAILED DESCRIPTION OF THE PRESENT INVENTION

In accordance with the present invention a device for delivering serial digital data at high data rates, such as signals of high definition video is provided. High definition video source means hereinafter a source of signals such as the sources defined by 1080P. Namely, that the output of this source is to be displayed across a screen of 1920×1080 pixels. A device of the present invention has four different one to one transmission line transformers (TLTs), structured and arranged for delivering signals which use for example four transmitting lanes, TMDS, LVDS signals. In this case three of the TLTs provide for delivering R, G, B digital signals such as of high definition video source. The fourth TLT respectively provides for delivering synchronization and timing signals. A device for delivering serial digital data at high data rates of the invention has a substantially homogeneous and flat frequency response curve. Furthermore a device of the invention is especially capable for suppressing parasitic signals and noise of low frequencies (up a few dozens of MHz).

Figure 1:
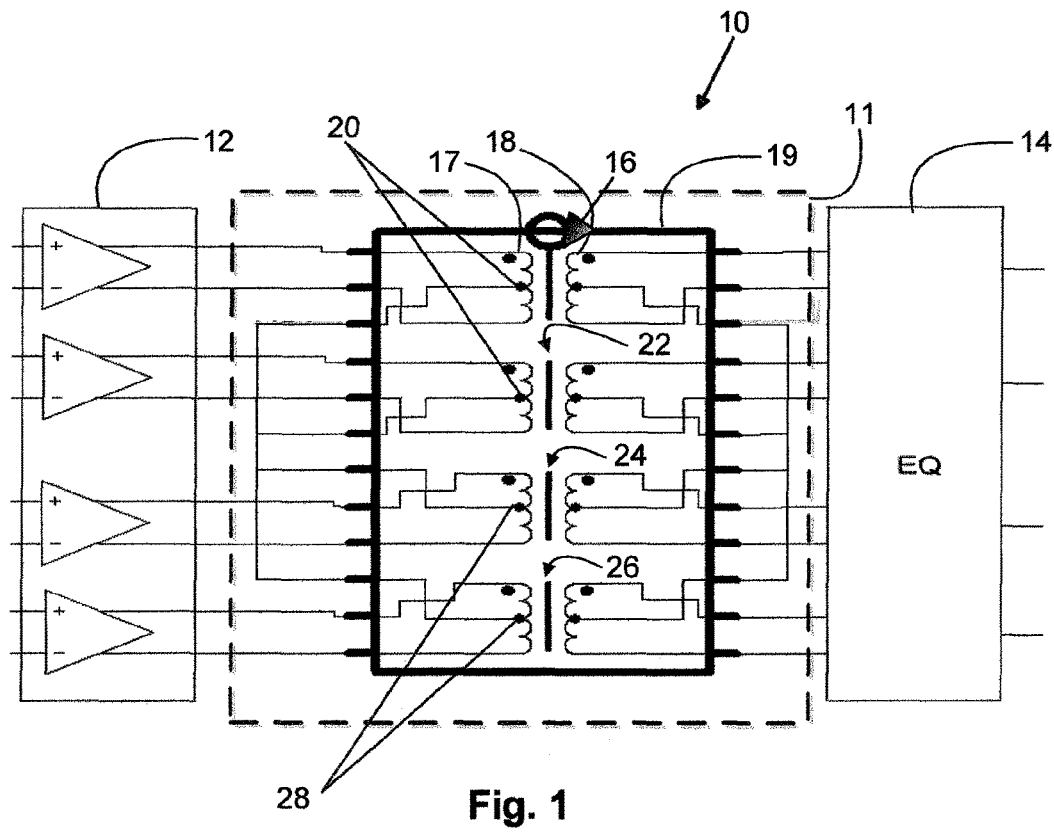
FIG. 1 is a block diagram of a device for delivering digital video signals of the present invention connecting between an array of line drivers and array of buffers.

Reference is first made to FIGS. 1-4B, in which a block diagram of a device of the invention, a scheme of one transformer and frequency response curves of a number of exemplary TLTs of devices for delivering serial digital data at high data rates of the invention are respectively shown. In FIG. 1 device for delivering serial digital data at high rates 10 is shown connecting between array of line receivers 12 and array 14 of four buffers, not shown. Device 10 includes linear array of four identical TLTs, such as TLT 16. All of the four transformers have primary coils such as coil 17 and a secondary coil such as coil 18. The four transformers are respectively adhered to each other at their mutual points of contact. An outermost transformer is adhered to the respective wall of enclosing package 19 at the mutual point of contact between a transformer's body and the respective wall. Enclosing package 19 is attached to a printed board, not shown. The mid points of the primary coils of all four transformers are electrically connected to each other to have the same voltage, referred hereinafter as zero voltage. Similarly the midpoints of all the secondary coils are electrically mutually connected.

One of the sides of each of the four transformers is directed towards a relatively short sidewall of enclosing packaging 19, which is the short sidewall closely disposed relative to this transformer. The opposite side of the same transformer faces at least two other transformers. Points 20 which are the midpoints of the primary coils of transformers 16 and 22 are electrically connected to pins of enclosing package 19. These pins are disposed at the sides directed towards transformers 24 and 26. Whereas the midpoints of the primary coils of transformers 24, 26 are positioned at the sides of the respective transformer that is directed towards transformers 22 and 16. Such an arrangement of the pins connected to the midpoints of all the primary coils of the four transformers provides for avoiding the drilling of holes through the printed board to which enclosing package 19 is attached, through which the electrically connecting wire of all these pins is to be threaded. The pins connected to the midpoints of the four secondary coils are similarly arranged. Therefore there is no need to drill any hole through the printed board that carries the enclosing package for electrically connecting the respective midpoints of the primary and/or secondary coils of all of the four transformers.

Figure 2:
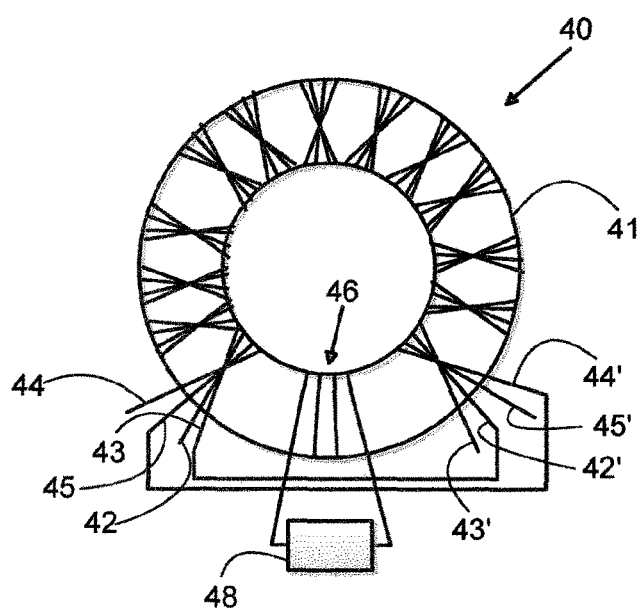
FIG. 2 is a simplified scheme of a transmission line transformer according to a preferred embodiment of the present invention.

In FIG. 2 a simplified scheme of a TLT 40 according to a preferred embodiment of the present invention is shown.

The primary and secondary coils of TLT 40 are winded around common magnetic permeable core that is shaped like a circular or oval ring 41. The body of ring 41 is made of material having relatively high level of magnetic permeability such as ferrite. Each of the primary and secondary coils of this TLT is formed by a pair of segments of electric wire. Each segment of a pair provides for winding a respective half of the respective coil. All the four halves of both the primary and secondary coils are winded in the same direction.

For producing a TLT according to a preferred embodiment of the present invention four segments of electric wire are first grouped together into a bundle. The bundle is axially twisted at a predefined pitch into a bundle of twisted wires. Namely, twisting is such applied that a predefined number of full simultaneous rotations of each segment relative to the axis of the bundle is formed along one unit of length, measured along this axis. Then the twisted bundle of four conductors is winded around the magnetic core such that a predefined number of turns are formed. End 42 of the first half of the primary coil is the first terminal of the primary coil. The other end of this conductor, which is designated by 42', is electrically connected to end 43 of the second half of the primary coil. The other terminal of the primary coil is end 43'. Similarly, one terminal of the secondary coil is end 44. The midpoint of the secondary coil is formed by connecting end 44' to end 45 of the second half of the secondary coil. The other terminal of the secondary coil is end 45'.

Dissipating circuit 46 provides for reducing the level of the response of this TLT to signals of low frequencies. Namely, frequencies disposed within a range of frequencies the lower end of which coincides with the lower end of the frequency range along which the response curve is measured. Dissipating circuit 46 has a coil of a predefined inductance that is wrapped around ring 41. Therefore this coil is coupled to the TLT by the magnetic flux that is present within the common magnetic core. Component 48 is according to a preferred embodiment of the present invention a capacitor of a predefined capacitance. Alternatively in accordance with another preferred embodiment of the present invention component 48 is an ohmic resistor of a predefined resistance level. Therefore this TLT practically serves as a band pass filter that transfers signals their frequencies lies out of a frequency range disposed close to the lower end of the range of frequencies along which the response curve is measured. The value of the lower frequency in which the response curve first reaches a considerable level, as well as the rising slope of the response curve are set by the user if he chooses not to include dissipating circuit, and/or by suitably selecting the levels of inductance and of ohmic resistance or the level of capacitance of the dissipating circuit. The upper frequency limit and the slope by which the response curve fades out are set by suitably selecting the permeability level of the magnetic core, the inductance levels of the TLT's coils and mainly by the parasitic inter winding capacitance and the inductance leakage.

Figure 3A:
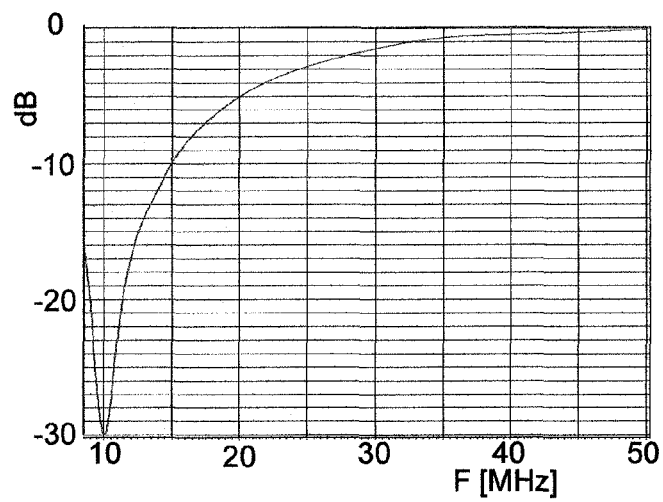
FIGS. 3A-3C are different frequency response curves of exemplary devices for delivering serial digital signals at high rate respectively having different dissipating circuits.
Figure 3B:
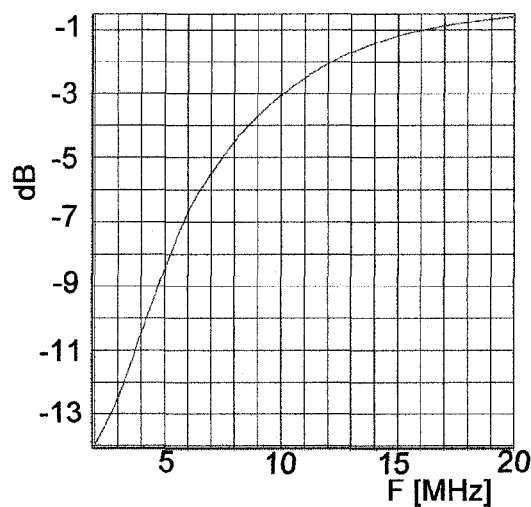
Figure 3C:
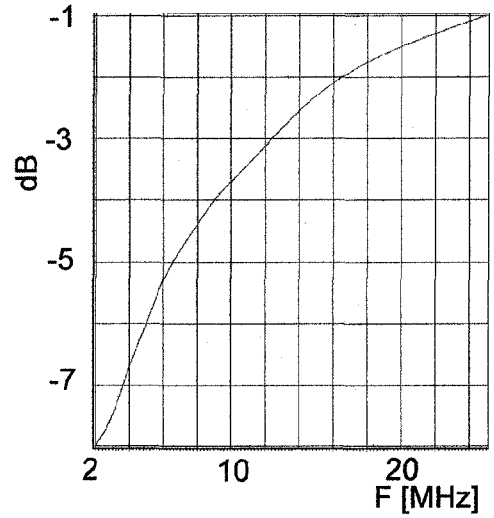

The impact of the levels of the inductance and capacitance or the inductance and the resistance of the dissipating circuit on the rising slope of the response curve at low frequencies is demonstrated by inspecting FIGS. 3A-3C. In FIG. 3A the dissipating circuit is a LC resonance circuit. Therefore a relatively sharp deep centered at selected frequency, say 10 MHz such as shown, is generated. The minimum of the response curve reaches −30 dB, which indicates a significant attenuation of signals of low frequencies which are typically originated by a noisy environment. FIG. 3B and FIG. 3C respectively demonstrate the influence of the magnitude of the ohmic resistance of the dissipating circuit on the rising slope of the response curve. The level of resistance of the device whose response curve is shown in FIG. 3B is higher compared to the resistance level of the device whose response curve is shown in FIG. 3C.

Figure 4A:
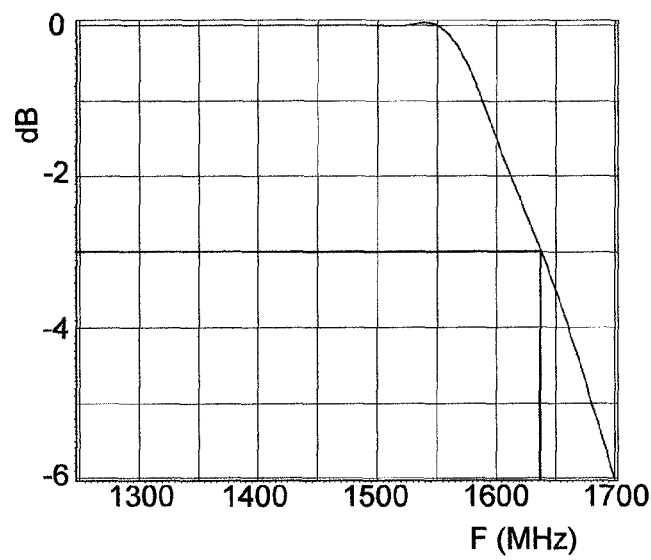
FIGS. 4A-4B are two response curves of a respective exemplary TLT which is included in a device that is selected from two devices for delivering serial digital signals at high rate according to two different preferred embodiments of the present invention.
Figure 4B:
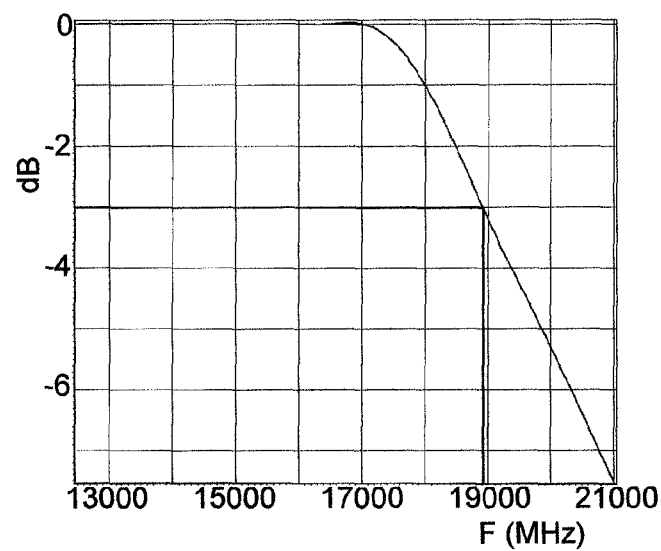

The simultaneous twisting of the bundle of four halves of the primary and secondary coils of a TLT of the invention, at a predefined pitch is one of the main factors according to the present invention which determine the reactance of a TLT. The pitch level of this twisting is crucial for fixing the upper frequency limit of the response curve of the TLT considered, while retaining the level of flatness of the response curve of this TLT. In FIGS. 4A-4B two response curves of two TLTs according to two different preferred embodiments of the present invention are respectively shown. In FIG. 4A the response curve as measured for one of these TLTs, which is the first TLT, is shown. The permeability of the magnetic core of this TLT is about 3000. The pitch of the twisting of the bundle of the conductors forming the halves of the primary and secondary coils is within the range of 2-5 turns per cm. The dissipating circuit of this TLT includes a resistor of a few Ohms. The inductance of the coil of the dissipating circuit is of 100-150 micro Henry (μH); the inductance of the primary coil of the TLT is within the same range. In FIG. 4B the response curve of a similar TLT, which is the second TLT, is shown. All the features of this TLT, except for the pitch level of the twisting of the bundle of conductors forming the halves of the primary and secondary coils are identical to the respective features of the first TLT (which is considered in FIG. 4A). However, the twisting level of the second TLT is close to 10 turns per cm.

The invention claimed is:

1. A transmission line transformer (TLT) having a response curve, said TLT comprising primary and secondary coils each of which having a midpoint, said coils are winded around common magnetic preamble core, said core having a permeability of 3000, each said coil is formed by a pair of segments of electric wire, wherein both of said pairs are grouped in a bundle of four segments of electric wire, said bundle is twisted 2-5 turns per cm, and wherein said bundle has an axis, and wherein said bundle axially twisted 10 turns per cm around said axis.

2. The TLT, according to claim 1, said TLT comprising a dissipating circuit which comprises a coil winded around said common magnetic permeable core, and wherein said dissipating circuit is structured and arranged to lower the level of said response curve at least at one frequency level internally disposed within a range of frequencies along which said response curve is to be measured.

3. The TLT of claim 1, wherein the midpoints of at least two of said primary coils are electrically connected.

4. The TLT of claim 2, wherein said dissipating circuit comprises a capacitor.

5. The TLT of claim 1, further comprising at least one enclosing package.

* * * * *